United States Patent
Ben-Aicha et al.

(10) Patent No.: US 10,641,829 B2
(45) Date of Patent: May 5, 2020

(54) METHOD FOR DIAGNOSING DEFECTS IN A SET OF STATIONARY BATTERIES

(71) Applicant: RENAULT s.a.s., Boulogne-Billancourt (FR)

(72) Inventors: Fehd Ben-Aicha, Guyancourt (FR); Do-Hieu Trinh, Fontenay-le-Fleury (FR); Philippe Toussaint, Versailles (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 394 days.

(21) Appl. No.: 15/519,728

(22) PCT Filed: Oct. 16, 2015

(86) PCT No.: PCT/FR2015/052786
§ 371 (c)(1),
(2) Date: Jul. 31, 2017

(87) PCT Pub. No.: WO2016/059355
PCT Pub. Date: Apr. 21, 2016

(65) Prior Publication Data
US 2017/0350945 A1    Dec. 7, 2017

(30) Foreign Application Priority Data
Oct. 17, 2014   (FR) .................................. 14 60028

(51) Int. Cl.
*G06F 19/00* (2018.01)
*G01R 31/367* (2019.01)
(Continued)

(52) U.S. Cl.
CPC ......... *G01R 31/367* (2019.01); *G01R 31/382* (2019.01); *G01R 31/392* (2019.01); *H01M 10/48* (2013.01); *H01M 2220/10* (2013.01)

(58) Field of Classification Search
CPC ...... F02B 2075/027; G05F 1/147; H02J 9/062
(Continued)

(56) References Cited

U.S. PATENT DOCUMENTS

| 5,602,462 A * | 2/1997 | Stich ...................... G05F 1/147 |
| | | 307/64 |
| 2004/0189255 A1* | 9/2004 | Koch ................. G01R 31/3842 |
| | | 320/132 |

(Continued)

FOREIGN PATENT DOCUMENTS

| EP | 2 720 343 A1 | 4/2014 |
| WO | 2008/152238 A2 | 12/2008 |
| WO | 20131094057 A1 | 6/2013 |

OTHER PUBLICATIONS

International Search Report dated Mar. 15, 2016 in PCT/FR2015/052786 filed Oct. 15, 2015.

(Continued)

*Primary Examiner* — Alexander Satanovsky
*Assistant Examiner* — Brent A. Fairbanks
(74) *Attorney, Agent, or Firm* — Oblon, McClelland, Maier & Neustadt, L.L.P.

(57) ABSTRACT

A method detects defects in an electrical power storage system including at least one battery. The method includes applying an instruction for charging or discharging the battery. The method also includes measuring the current passing through the battery during application of the instruction and calculating m×n mean errors (eTj(tij))1≤j≤m, 1≤i≤n between the measured current and the theoretical current of the instruction in m×n time intervals ([tij, tij+Tj])1≤j≤m, 1≤i≤n, respectively. The method also includes calculating, for each j between 1 and m, ej=max(eTj (tij)), where i= 1, . . . , n. Lastly, the method includes incrementing a counter Cj if ej completely or partially exceeds a predetermined threshold. A defect is detected if Cj exceeds a predetermined threshold.

7 Claims, 2 Drawing Sheets

(51) Int. Cl.
    *G01R 31/382*     (2019.01)
    *G01R 31/392*     (2019.01)
    *H01M 10/48*     (2006.01)

(58) Field of Classification Search
    USPC .................................. 702/63–67, 182–185
    See application file for complete search history.

(56) References Cited

U.S. PATENT DOCUMENTS

| | | | |
|---|---|---|---|
| 2010/0063974 A1* | 3/2010 | Papadimitriou ... | G06K 9/00496 |
| | | | 707/758 |
| 2010/0085063 A1 | 4/2010 | Lebrunie et al. | |
| 2011/0227414 A1 | 9/2011 | Fischer | |
| 2012/0049803 A1* | 3/2012 | Lee ...................... | H01M 10/44 |
| | | | 320/137 |
| 2013/0069433 A1 | 3/2013 | Fischer | |
| 2014/0074797 A1* | 3/2014 | McFarland ...... | G06Q 10/06375 |
| | | | 707/688 |
| 2014/0074867 A1* | 3/2014 | McFarland ........ | G06Q 10/0639 |
| | | | 707/754 |
| 2014/0184166 A1 | 7/2014 | Ohkawa et al. | |
| 2014/0278165 A1* | 9/2014 | Wenzel ................. | G06Q 50/08 |
| | | | 702/61 |
| 2014/0339891 A1 | 11/2014 | Ohkawa et al. | |

OTHER PUBLICATIONS

French Search Report dated Jun. 16, 2015 in FR 1460028 filed Oct. 17. 2014.

\* cited by examiner

METHOD FOR DIAGNOSING DEFECTS IN A SET OF STATIONARY BATTERIES

The present invention relates to a method for diagnosing faults in a set of stationary batteries. It applies in particular to installations for storing energy from renewable sources of wind or photovoltaic type.

In the current context of agreement surrounding global warming, reducing carbon dioxide ($CO_2$) emissions is a major challenge facing all industries, in particular energy producers and motor vehicle manufacturers, with the standards always being more stringent in these areas.

In the motor vehicle manufacturing sector, in addition to the constant improvement in the performance of conventional thermal combustion engines, which is accompanied by a drop in $CO_2$ emissions, electric vehicles and thermoelectric hybrid vehicles are nowadays considered to be the most promising solution for reducing $CO_2$ emissions. In the remainder of the present application, the expression 'electric vehicles' refers indiscriminately to electric vehicles and thermoelectric hybrid vehicles, including rechargeable hybrid vehicles.

Various technologies have been considered for designing traction batteries for electric vehicles, each having advantages and drawbacks. In particular, lithium-ion (li-ion) technology offers an excellent compromise between energy density and power density that is ideal for motor vehicle applications. However, implementing this technology does not come without numerous difficulties, both for technical reasons and for economic reasons. Specifically, the li-ion batteries used for the traction of electric vehicles undergo a loss of capacity as a function of time and as a function of conditions of use. Starting from a certain capacity threshold, the autonomy of these batteries is no longer sufficient for use in a motor vehicle, and it is necessary to replace them. Unfortunately, the cost of storing and recycling li-ion batteries is very high, and offsets the economic profitability of these batteries. This is why the applicant is working to extend the life of these batteries, by proposing to use them for other applications, in particular stationary applications for storing renewable electrical energy of wind or photovoltaic type, with a view to supplying buildings with electric power. Specifically, by prolonging the duration of the amortization of the cost of the battery, this makes it possible to absorb its recycling cost and therefore to increase its economic profitability. The applicant has thus developed an energy storage system for supplying buildings with electric power, this system using batteries that are 'recycled' in the sense that they have had a first use or 'first life' in electric vehicles. Reference is thus made to a 'second life' for these batteries. However, as the batteries have already aged, particular care must be taken to maintain the system in order to ensure the required safety and performance levels. This is one problem that the present invention proposes to solve.

Patent EP2147323 discloses a system of stationary batteries used for supplying power to a building and including means for detecting battery faults. One major drawback of this solution is that it does not give a precise indication with regard to the origin of the faults, leaving the precise diagnostic work to the maintenance operator. This is another problem that the present invention proposes to solve.

The aim of the present invention is to overcome the aforementioned drawbacks and in particular to provide a diagnosis regarding the attainment of the charge or discharge setpoint of stationary batteries. To this end, one subject of the invention is a method for detecting faults in an electrical energy storage system including at least one battery. The method includes a step of applying a charge or discharge setpoint to the battery. It also includes a step of measuring the current passing through the battery during the application of this setpoint. It also includes a step of calculating m×n mean errors $(e_{T_j}(t_i^j))_{1 \leq j \leq m, 1 \leq i \leq n}$ between the measured current and the theoretical setpoint current in m×n time intervals $([t_i^j, t_i^j + T_j])_{1 \leq j \leq m, 1 \leq i \leq n}$, respectively. It also includes a step of calculating, for any value of j between 1 and m, $$e_j = \max_{i=1,\ldots,n} \left( e_{T_j}(t_i^j) \right).$$

Finally, it includes a step of incrementing a counter $C_j$ if $e_j$ exceeds a predetermined threshold in terms of absolute value or in terms of relative share. A fault is detected if $C_j$ exceeds a predetermined threshold.

In one advantageous embodiment, for any value of j between 1 and m and for any value of i between 1 and n, $t_{i+1}^j = t_i^j + \Delta t^j$, where $\Delta t^j$ may be a predetermined sampling interval.

In one even more advantageous embodiment, the counter $C_j$ may be incremented if $T_3$ is a duration shorter than a predetermined threshold and $e_j$ exceeds a predetermined threshold for amperes, or if $T_j$ is a duration longer than the predetermined threshold and the ratio between $e_j$ and a predetermined mean error for said duration $T_j$ exceeds a predetermined ratio.

For example, the mean error $e_{T_j}(t_i^j)$ may be calculated by:

$$e_{T_j}(t_i^j) = e_{T_j}^{RMS}(t_i^j) = \sqrt{\frac{1}{T_j} \int_{t_i^j}^{t_i^j + T_j} (I^{Bat}(\tau) - I^{cons}(\tau))^2 d\tau}$$

In one very particularly advantageous embodiment, the method may include a step of raising a fault alarm, the alarm being able to include indicating, if $T_j \leq threshold_1$, that the origin of the fault is a connector fault, where $threshold_1$ is a predetermined time threshold, if $threshold_1 \leq T_j \leq threshold_2$, that the origin of the fault is a sensor fault, where $threshold_2$ is a predetermined time threshold, and, if $threshold_2 \leq T_j$, that the origin of the fault is the ageing of the battery.

Another subject of the present invention is a system, for storing electrical energy from a renewable source, including at least one battery, and hardware means and software means for implementing such a method for detecting faults.

A final subject of the present invention is a building including such a system.

The primary advantage of the present invention is that it makes it possible not only to detect battery faults but also to isolate defective batteries in order to be able to change them, thereby improving performance, and to focus on maintenance, thereby improving the services offered to the client.

Other features and advantages of the invention will become apparent by way of the following description, given with reference to the appended drawings, in which.

Figure 1:
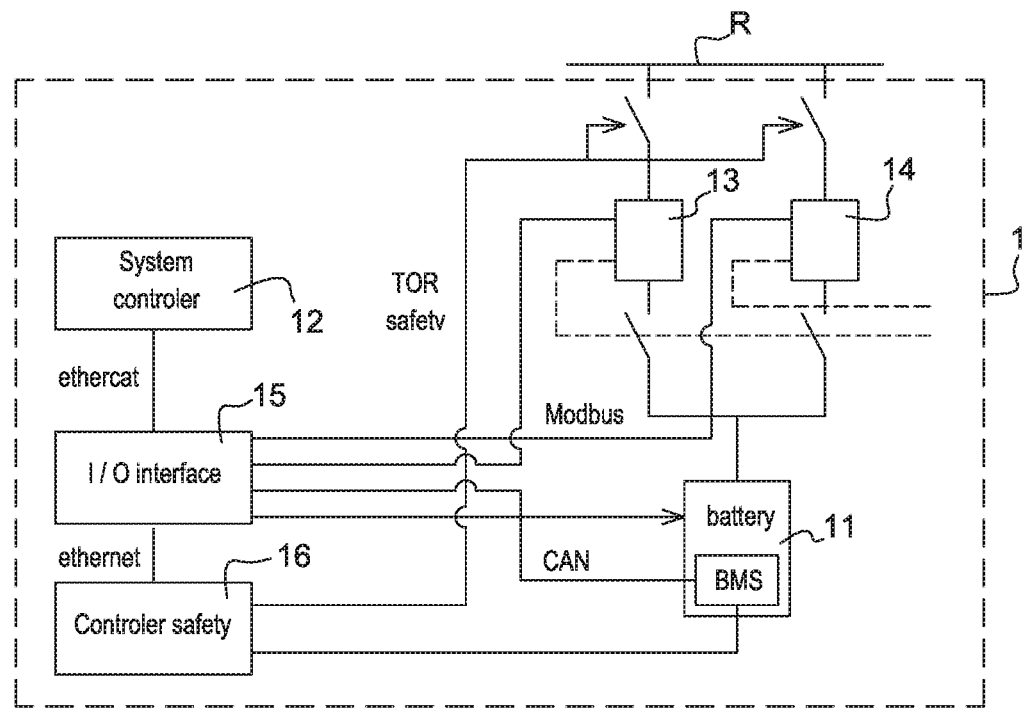
FIG. 1 shows, using an architecture diagram, one example of a system in which the invention may be implemented.

FIG. 1 shows a system 1 including a battery 11 with its battery management system (BMS) control system, the battery 11 being linked to an electricity distribution network R by means of a charging and discharging system making it possible to transform a three-phase or single-phase alternating current into direct current, and vice versa.

Figure 2A:
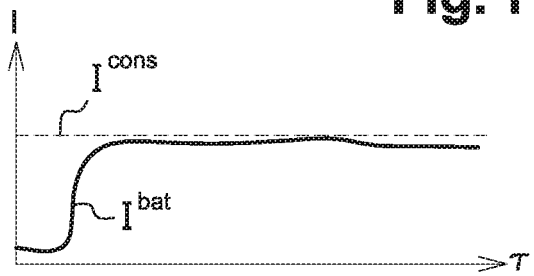
FIGS. 2a, 2b, 2c and 2d show, using graphs, one principle of the invention of comparing a charge setpoint with the attainment of this setpoint.

In order to meet the needs of the building in terms of current, a main controller of the system 12 acts as supervisor for the various modules of the system. In particular, the method according to the invention may be implemented therein. In particular, it sends a charge (or, respectively, discharge) power P setpoint to a charger 13 (or, respectively, to an inverter 14). An interface module 15 enables communication between the computers and the other components of the system, via EtherCAT, Ethernet, CAN and Modbus networks, the use of which is well known. A controller 16 is dedicated to diagnosing electrical problems at the hardware level: if a problem is detected, for example a short circuit, the computer 16 opens circuit breakers, not shown in the figures, positioned between the network R and the charger 13 and the inverter 14. Given the measurement of the voltage U across the terminals of the battery 11, the power P setpoint may be interpreted as a charge (or, respectively, discharge) current I setpoint via the relationship P=U×I. One principle of the invention shown by FIGS. 2a to 2d is that of comparing the progression over time τ of the measured current $I^{bat}$ actually passing through the battery 11 with the current setpoint $I^{cons}$. In concrete terms, the invention proposes calculating the error between the current setpoint $I^{cons}$ and the measured current $I^{bat}$. FIG. 2a thus shows this comparison in an ideal case without a fault: the measured current $I^{bat}$ is shown by a solid line, while the current setpoint $I^{cons}$ is shown by a broken line. The error may be calculated when the system is in charging phase or when it is in discharging phase, this being carried out indiscriminately.

Figure 2B:
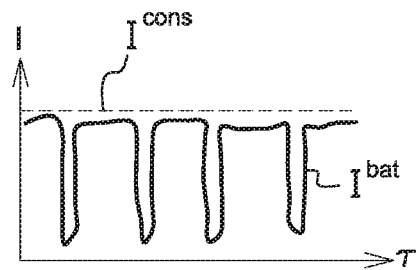
Figure 2C:
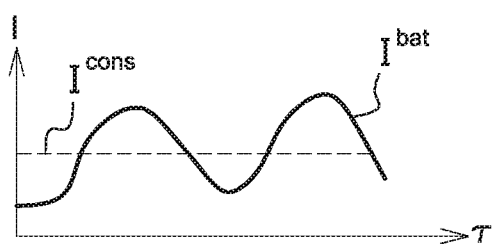
Figure 2D:
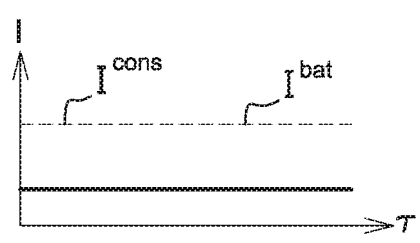

Another principle of the invention is that of calculating this error in sliding time windows having variable durations. This makes it possible to deduce the frequency with which the fault appears, and to focus on the appropriate treatment as a function of this frequency. FIGS. 2b, 2c and 2d show three frequency ranges and therefore three types of fault that may be distinguished by the invention: FIG. 2b shows high-frequency faults (they are repeated on a regular basis, for example 4 times in the time interval under consideration in FIG. 2b), which indicate a connector problem, FIG. 2c illustrates medium-frequency faults (they are repeated on a less regular basis, for example twice in the time interval under consideration in FIG. 2c), which indicate sensor problems, and FIG. 2d shows low-frequency faults (they are continuous in the time interval under consideration in FIG. 2d), which indicate ageing problems.

The mean error between the setpoint current $I^{cons}$ and the measured current $I^{bat}$ in a time window of duration T extending between an instant t and the instant t+T may for example be given by the root mean square:

$$e_T^{RMS}(t) = \sqrt{\frac{1}{T}\int_t^{t+T}(I^{Bat}(\tau) - I^{cons}(\tau))^2 d\tau}$$

where the abbreviation RMS stands for root mean square.

The maximum error over all of the time windows of duration T under consideration is then given by:

$$e_{max}^{RMS}(T) = \max_i(e_T^{RMS}(t))$$

Figure 3A:
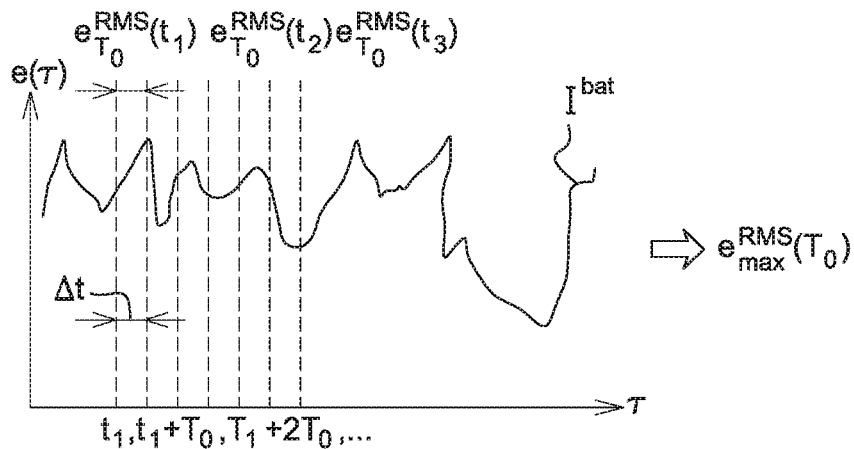
FIGS. 3a, 3b and 3c show, using graphs, one exemplary embodiment of the method according to the invention.
Figure 3B:
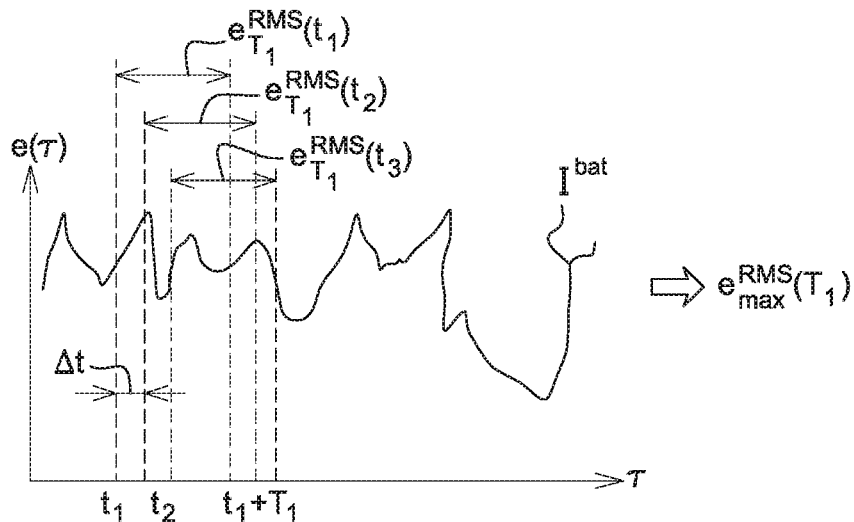
Figure 3C:
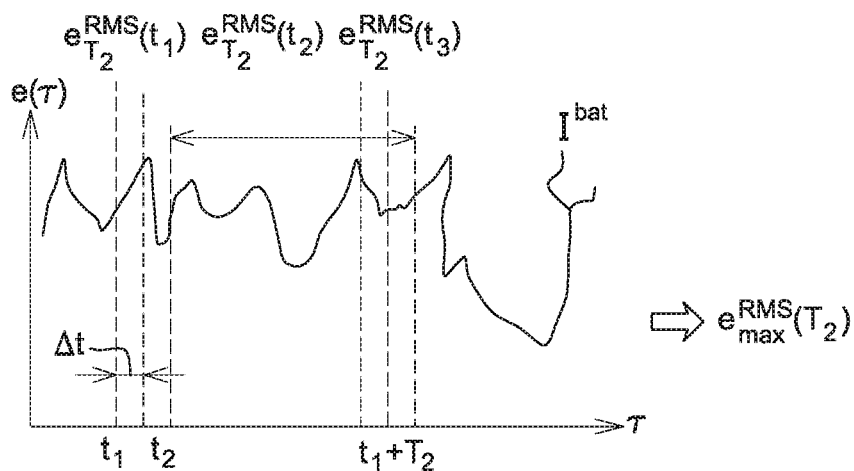

FIGS. 3a, 3b and 3c show, for one and the same profile of the current IbaC given as a function of time τ, the steps of calculating the maximum error $e_{max}^{RMS}(T_j)$ according to the invention.

First of all, as illustrated by FIG. 3a, an error $e_{T_0}^{RMS}(t_1)$ is calculated over a first time window of duration $T_0$ between an instant $t_1^0$ and an instant $t_1^0+T_0$. A time sampling interval $\Delta t^0$ is then chosen to slide the time window from the first instant $t_1^0$ to a second instant $t_2^0=t_1^0+\Delta t^0$. An error $e_{T_0}^{RMS}(t_2^0)$ is then calculated over a second time window of duration $T_0$ between the instant $t_2^0$ and an instant $t_2^0+T_0$. An error $e_{T_2}^{RMS}(t_3^0)$ is then calculated over a third time window of duration $T_0$ between an instant $t_3^0=t_2^0+\Delta t^0$ and an instant $t_3^0+T_0$. This is continued until an error $e_{T_0}^{RMS}(t_2^0)$ is calculated over an $n^{th}$ time window of duration $T_0$ between an instant $t_n^0=t_{n-1}^0+\Delta t^0$ and an instant $t_n^{0+T_0}$. The maximum error $$e_{max}^{RMS}(T_0) = \max_{i=1,\ldots,n}\left(e_{T_0}^{RMS}(t_i^0)\right)$$

is then calculated.

Next, as illustrated by FIG. 3b, an error $e_{T_1}^{RMS}(t_1^3)$ is calculated over a first time window of duration $T_1$, longer than $T_0$, between the instant $t_1^1$ and an instant $t_1^1+T_1$. A time sampling interval $\Delta t_1$ is then chosen to slide the time window from the first instant $t_1^1$ to a second instant $t_2^1=t_1^1+\Delta t^1$. An error $e_{T_1}^{RMS}(t_2^1)$ is then calculated over a second time window of duration $T_1$ between the instant $t_2^1$ and an instant $t_2^1+T_1$. An error $e_{T_1}^{RMS}(t_3^1)$ is then calculated over a third time window of duration $T_1$ between the instant $t_3^1$ and an instant $t_3^1+T_1$. This is continued until an error $e_{T_1}^{RMS}(t_0^1)$ is calculated over an $n^{th}$ time window of duration $T_1$ between the instant $t_n^1$ and an instant $t_n^1+T_1$. The maximum error $$e_{max}^{RMS}(T_1) = \max_{i=1,\ldots,n}\left(e_{T_1}^{RMS}(t_i^1)\right)$$

is then calculated.

Next, as illustrated by FIG. 3c, an error $e_{T_2}^{RMS}(t_3^2)$ is calculated over a first time window of duration $T_2$, longer than $T_1$, between the instant $t_1^2$ and an instant $t_1^2+T_2$. An error $e_{T_1}^{RMS}(t_2^2)$ is then calculated over a second time window of duration $T_2$ between the instant $t_2^2$ and an instant $t_2^2+T_2$. An error $e_{T_2}^{RMS}(t_3^2)$ is then calculated over a third time window of duration $T_2$ between the instant $t_3^2$ and an instant $t_3^2+T_2$. This is continued until an error $e_{T_2}^{RMS}(t_2^2)$ is calculated over an $n^{th}$ time window of duration $T_2$ between the instant $t_n^2$ and an instant $t_n^2+T_2$. The maximum error $$e_{max}^{RMS}(T_2) = \max_{i=1,\ldots,n}\left(e_{T_2}^{RMS}(t_i^2)\right)$$

is then calculated.

The calculation process continues like this m times, until $$e_{max}^{RMS}(T_m) = \max_{i=1,\ldots,n}\left(e_{T_m}^{RMS}(t_i^m)\right)$$

is calculated over n sliding windows of duration $T_m$, longer than the windows $T_{m-1}$.

The choice of the durations $T_j$, for $1 \leq j \leq m$, depends on the response time of the system, that is to say on the time necessary for the desired setpoint to be reached. In the present case, this is the time for establishment of the current. In the following exemplary embodiment, the durations $T_1=1$ s, $T_2=10$ s, $T_3=100$ s, $T_4=1000$ s and $T_5=3600$ s have been chosen.

Each time the maximum error $e_{max}^{RMS}(T_j)$l where $1 \leq j \leq m$, exceeds a predefined threshold, a confirmation counter $C_j$ is incremented: if the counter itself reaches a threshold that is predefined through calibration, a fault is deemed to have been detected. By contrast, if at the end of a certain period that is also predefined the confirmation threshold has not been reached, then the counter $C_j$ is reset to zero.

In the remainder of the present application, the terms defect and fault are used indiscriminately.

First series of sliding windows:
- $T_0$: 1 second (s)
- $\Delta t^0$: 20 milliseconds (ms)
- Total duration of the observation between $t_1^0$ and $T_n^0+T_0$: 10 s
- Overlap between 2 successive sliding windows of duration $T_0$: 400 ms
- Number of confirmations to the counter $C_0$ before detection of a defect: 30 confirmations
- Time before resetting of the counter $C_0$ to zero if no defect detected: 30 minutes (min)

This means that a defect that recurs every second may be confirmed in 5 minutes at the earliest and in 15 hours at the latest.

Second Series of Sliding Windows:
- $T_1$: 10 s
- $\Delta t^1$: 200 ms
- Total duration of the observation between $t_1^1$ and $T_n^1+T_1$: 100 s
- Overlap between 2 successive sliding windows of duration $T_1$: 4 s
- Number of confirmations to the counter $C_1$ before detection of a defect: 15 defects
- Time before resetting of the counter $C_1$ to zero if no defect detected: 1 hour (h)

This means that a defect that recurs every second may be confirmed in 25 minutes at the earliest and in 15 hours at the latest.

Third Series of Sliding Windows:
- $T_2$: 100 s
- $\Delta t^2$: 2 s
- Total duration of the observation between $t_1^2$ and $T_n^2+T_2$: 1000 s
- Overlap between 2 successive sliding windows of duration $T_2$: 40 s
- Number of confirmations to the counter $C_2$ before detection of a defect: 5 defects
- Time before resetting of the counter $C_2$ to zero if no defect detected: 5 h This means that a defect that recurs every second may be confirmed in 80 minutes at the earliest and in 25 hours at the latest.

Fourth Series of Sliding windows:
- $T_3$: 1000 s
- $\Delta t^3$: 20 s
- Total duration of the observation between $t_1^3$ and $T_n^3+T_3$: 5000 s
- Overlap between 2 successive sliding windows of duration $T_3$: 400 s
- Number of confirmations to the counter $C_3$ before detection of a defect: 3 defects
- Time before resetting of the counter $C_3$ to zero if no defect detected: 8 h This means that a defect that recurs every second may be confirmed in 4 hours at the earliest and in 24 hours at the latest.

Fifth Series of Sliding Windows:
- $T_4$: 3600 s
- $\Delta t^4$: 20 s
- Total duration of the observation between $t_1^4$ and $T_n^4+T_4$: 10 800 s
- Overlap between 2 successive sliding windows of duration $T_4$: 1440 s
- Number of confirmations to the counter $C_4$ before detection of a defect: 2 defects
- Time before resetting of the counter $C_4$ to zero if no defect detected: 12 h This means that a defect that recurs every second may be confirmed in 6 hours at the earliest and in 24 hours at the latest.

For windows having short durations, in particular having durations $T_0$, $T_1$ and $T_2$, the absolute value of the error may be considered to be significant. In these cases, the errors $e_{max}^{RMS}(T_0)$, $e_{max}^{RMS}(T_1)$ and $e_{max}^{RMS}(T_2)$ may be compared, with a view to incrementing the counters $C_0$, $C_1$ and $C_2$, respectively, with absolute thresholds for amperes (A), such as $ST_0=6$ A, $ST_1=4$ A and $ST_2=2$ A, respectively. Meanwhile, for windows having longer durations, in particular $T_3$ and $T_4$, the absolute value of the error may not be considered to be significant. Specifically, when working over short periods, that is to say high-frequency periods, high current peaks are monitored, and one therefore thinks in terms of the absolute value of the error. Meanwhile, for lower frequencies, it is sought to monitor the performance of the system., and one therefore thinks in terms of the percentage to which the setpoint has been attained, which corresponds substantially to a performance. In these cases, these are the relative errors $e_{max}^{RMS}(T_3)$ /mean_current_$T_3$ and $e_{max}^{RMS}(T_4)$/RMS_current_$T_4$, where Mean_current_$T_3$ and RMS_current_$T_4$ denote the mean currents over the periods $T_3$ and $T_4$, respectively, calculated by $$\sqrt{\frac{1}{T_3}\int_t^{t+T_3}(I^{cons}(\tau))^2 d\tau} \text{ and } \sqrt{\frac{1}{T_4}\int_t^{t+T_4}(I^{cons}(\tau))^2 d\tau},$$

respectively, which may be compared with ratios such as 0.8 and 0.75, respectively. It is necessary to note that the reduction in the values of the thresholds is large in order to be able to distinguish the diagnoses from one another. Specifically, particular care must be taken to calibrate the thresholds in order to be able to distinguish between the various diagnoses separately. For example, an exceedance of 20 A over a period of 1 second corresponds to an exceedance of 2 A over a range of 10 seconds. Thus, if the diagnosis has to be carried out over the window of 1 second and not by the window of 10 seconds, then the threshold of the 10-second window must be greater than 2 A.

The above exemplary embodiment makes it possible to assist maintenance staff in taking appropriate decisions as a function of the type of fault:
- if a fault is detected for a duration $T_j$ of the order of 1 to 10 seconds, then the system can be stopped immediately and the maintenance staff may be directed toward connector problems (continuity tests) or system, instability problems (software updates);
- if a fault, is detected for a duration $T_j$ of the order of 100 s, then the maintenance staff may be directed toward sensor drift (anticipation of changing sensors);
- if a fault is detected for a duration $T_j$ of the order of 1000 seconds or more, then it is probably due to the effect of ageing and it is thus necessary to anticipate changing the battery.

By providing a precise diagnosis with regard to the origin of the fault, the invention therefore affords the additional advantage of significantly reducing maintenance costs.

The invention claimed is:

1. A method for detecting faults in a stationary electrical energy storage system including at least one battery, the method comprising:
   applying, using circuitry, a charge or discharge setpoint to the at least one battery of the stationary electrical energy storage system;
   measuring, using the circuitry, current passing through the at least one battery during the applying of said setpoint;
   calculating, using the circuitry, m×n mean errors $(e_{T_j}(t_i^j))_{1 \leq j \leq m, 1 \leq i \leq n}$ between the measured current and a theoretical setpoint current in m×n time intervals $([t_i^j, t_i^j+T_j])_{1 \leq j \leq m, 1 \leq i \leq n}$, respectively;
   calculating, using the circuitry, for any value of j between 1 and m, $$e_j = \max_{i=1,\ldots,n} \left(e_{T_j}(t_i^j)\right);$$

incrementing, using the circuitry, a counter $C_j$ when $e_j$ exceeds a predetermined threshold in terms of absolute value or in terms of relative share;
   detecting, using the circuitry, a fault when $C_j$ exceeds the predetermined threshold; and
   identifying, using the circuitry, a type of the detected fault.

2. The method as claimed in claim 1, wherein, for any value of j between 1 and m and for any value of i between 1 and n, $t_{i+1}^j = t_i^j + \Delta t^j$, where $\Delta t^j$ is a predetermined sampling interval.

3. The method as claimed in claim 1, wherein the counter $C_j$ is incremented when one of the two following conditions is fulfilled:
   $T_j$ is a duration shorter than the predetermined threshold and $e_j$ exceeds a predetermined threshold for amperes, or;
   $T_j$ is a duration longer than the predetermined threshold and a ratio between $e_j$ and a predetermined mean error for said duration $T_j$ exceeds a predetermined ratio.

4. The method as claimed in claim 1, wherein the mean error $e_{T_i}(t_i^j)$ is calculated by:

$$e_{T_j}(t_i^j) = e_{T_j}^{RMS}(t_i^j) = \sqrt{\frac{1}{T} \int_{t_i^j}^{t_i^j + T_j} (I^{Bat}(\tau) - I^{cons}(\tau))^2 d\tau} \, .$$

5. The method as claimed in claim 1, further comprising raising a fault alarm, said alarm including indicating:
   when $T_j \leq threshold_1$, that an origin of the fault is a connector fault, where $threshold_1$ is a first predetermined time threshold;
   when $threshold_1 \leq T_j \leq threshold_2$, that the origin of the fault is a sensor fault, where $threshold_2$ is a second predetermined time threshold; and
   when $threshold_2 \leq T_j$, that the origin of the fault is ageing of the battery.

6. A system for storing electrical energy from a renewable source, including the at least one battery, the system comprising:
   hardware and software configured to implement the method as claimed in claim 1.

7. A building, comprising:
   the system as claimed in claim 6.

* * * * *